(12) United States Patent
Park

(10) Patent No.: US 10,879,710 B2
(45) Date of Patent: Dec. 29, 2020

(54) APPARATUS FOR PREVENTING OVER-DISCHARGE OF BATTERY

(71) Applicant: HYUNDAI AUTRON CO., LTD., Seongnam-si (KR)

(72) Inventor: Jae Seong Park, Suwon-si (KR)

(73) Assignee: Hyundai Autron Co., Ltd., Seoul (KR)

( * ) Notice: Subject to any disclaimer, the term of this patent is extended or adjusted under 35 U.S.C. 154(b) by 438 days.

(21) Appl. No.: 15/806,657

(22) Filed: Nov. 8, 2017

(65) Prior Publication Data

US 2018/0131208 A1 May 10, 2018

(30) Foreign Application Priority Data

Nov. 9, 2016 (KR) .................. 10-2016-0148921

(51) Int. Cl.
*H02J 7/00* (2006.01)
*H02J 9/00* (2006.01)
(Continued)

(52) U.S. Cl.
CPC ............ *H02J 7/0031* (2013.01); *B60L 50/15* (2019.02); *B60L 58/14* (2019.02); *B60L 58/20* (2019.02);
(Continued)

(58) Field of Classification Search
CPC .................................................... H02J 7/0031
(Continued)

(56) References Cited

U.S. PATENT DOCUMENTS

| 6,362,599 B1 * | 3/2002 | Turner | H02J 7/0063 320/104 |
| 2009/0278501 A1 * | 11/2009 | Ho | H02J 7/0031 320/134 |

(Continued)

FOREIGN PATENT DOCUMENTS

| KR | 10-2007-0051098 A | 5/2007 |
| KR | 10-2013-0069001 A | 6/2013 |

(Continued)

OTHER PUBLICATIONS

Office Action from Chinese patent application No. 201711065061.6, Chinese Intellectual Property Office, dated Jul. 16, 2020, China.

*Primary Examiner* — Jerry D Robbins
(74) *Attorney, Agent, or Firm* — Baker & Hostetler LLP; Hyunho Park

(57) ABSTRACT

An apparatus for preventing a battery from being over-discharged according to the present invention includes: a latch relay which connects or disconnects the load of the vehicle; a voltage measuring circuit which measures a voltage of the auxiliary battery for every predetermined period when a ignition of the vehicle is off, and compares the measured voltage of the auxiliary battery with one or more over-discharge reference values that serve as references for determining whether the auxiliary battery is over-discharged; and a control unit which turns off the latch relay when the voltage of the auxiliary battery is equal to or less than the over-discharge reference value as a result of the comparison by the voltage measuring circuit, in which the voltage measuring circuit outputs an enable signal for operating the control unit when the voltage of the auxiliary battery is equal to or less than the over-discharge reference value.

11 Claims, 2 Drawing Sheets

(51) Int. Cl.

| | |
|---|---|
| *B60R 16/03* | (2006.01) |
| *B60L 58/20* | (2019.01) |
| *B60L 50/15* | (2019.01) |
| *B60L 58/14* | (2019.01) |
| *G01R 31/3835* | (2019.01) |
| *H02J 7/34* | (2006.01) |
| *B60R 16/033* | (2006.01) |
| *G01R 19/165* | (2006.01) |
| *B60L 1/00* | (2006.01) |

(52) U.S. Cl.
 CPC ............ *B60R 16/03* (2013.01); *B60R 16/033* (2013.01); *G01R 19/16542* (2013.01); *G01R 31/3835* (2019.01); *H02J 7/0047* (2013.01); *H02J 7/342* (2020.01); *H02J 9/002* (2013.01); *B60L 1/00* (2013.01); *B60L 2240/547* (2013.01); *H02J 7/00306* (2020.01)

(58) Field of Classification Search
 USPC ......................................................... 320/104
 See application file for complete search history.

(56) References Cited

U.S. PATENT DOCUMENTS

| | | | | |
|---|---|---|---|---|
| 2012/0029852 | A1* | 2/2012 | Goff | G01R 31/371 |
| | | | | 702/63 |
| 2014/0042981 | A1* | 2/2014 | Kaizo | H02J 2207/20 |
| | | | | 320/136 |
| 2016/0207403 | A1* | 7/2016 | Iida | B60L 53/14 |
| 2018/0366791 | A1* | 12/2018 | Kondo | H01M 10/425 |

FOREIGN PATENT DOCUMENTS

| | | |
|---|---|---|
| KR | 101296141 B1 | 8/2013 |
| KR | 101364856 B1 | 2/2014 |
| KR | 10-2015-0077820 A | 7/2015 |

\* cited by examiner

APPARATUS FOR PREVENTING OVER-DISCHARGE OF BATTERY

CROSS-REFERENCE TO RELATED APPLICATIONS

This application claims priority to and the benefit of Korean Patent Application No. 10-2016-0148921 filed in the Korean Intellectual Property Office on Nov. 9, 2016, the entire contents of which are incorporated herein by reference.

TECHNICAL FIELD

The present invention relates to a technology for preventing over-discharge of a battery, and particularly, to a technology for preventing over-discharge of a battery, which measures a voltage of an auxiliary battery provided in a vehicle even when a ignition of a vehicle is off and prevents over-discharge of the battery when the auxiliary battery is over-discharged.

BACKGROUND ART

In general, an auxiliary battery for supplying power to electronic components, such as a lamp and a control unit, is provided in a vehicle. In the past, the auxiliary battery is formed of a lead storage battery, so that even when the auxiliary battery is completely discharged, the auxiliary battery is re-usable by re-charging the auxiliary battery by using an external jump line.

However, recently, the auxiliary battery has been changed from the lead storage battery to a lithium ion battery, and unlike the lead storage battery, when the lithium ion battery is completely discharged, it is necessary to replace the battery itself, so that a stable protection with respect to over-discharge of the battery is required. Accordingly, a technology for preventing over-discharge of an auxiliary battery formed of a lithium ion battery has significantly advanced.

SUMMARY OF THE INVENTION

The present invention has been made in an effort to prevent over-discharge of an auxiliary battery by detecting over-discharge of an auxiliary battery even when a ignition of a vehicle is off.

An exemplary embodiment of the present invention provides an apparatus for preventing a battery from being over-discharged, the apparatus including: a latch relay which connects or disconnects the load of the vehicle; a voltage measuring circuit which measures a voltage of the auxiliary battery for every predetermined period when a ignition of the vehicle is off, and compares the measured voltage of the auxiliary battery with one or more over-discharge reference values that serve as references for determining whether the auxiliary battery is over-discharged; and a control unit which turns off the latch relay when the voltage of the auxiliary battery is equal to or less than the over-discharge reference value as a result of the comparison by the voltage measuring circuit, in which the voltage measuring circuit outputs an enable signal for operating the control unit when the voltage of the auxiliary battery is equal to or less than the over-discharge reference value.

In the exemplary embodiment, the auxiliary battery may be a lithium ion battery.

In the exemplary embodiment, the apparatus may further include a timer which sets the predetermined period.

In the exemplary embodiment, the apparatus may further include a reference voltage setting device which sets the over-discharge reference value.

In the exemplary embodiment, the over-discharge reference value may include a first over-discharge reference value that serves as a reference for charging the auxiliary battery and a second over-discharge reference value that serves as a reference for turning off the latch relay.

In the exemplary embodiment, the first over-discharge reference value may be higher than the second over-discharge reference value.

In the exemplary embodiment, the apparatus may further include a power supplying unit which supplies operation power to the control unit, in which when the voltage of the auxiliary battery is equal to or less than the over-discharge reference value, the voltage measuring circuit may output the enable signal for operating the control unit to the power supplying unit.

In the exemplary embodiment, the apparatus may further include a charger which charges the voltage of the auxiliary battery, in which when the voltage of the auxiliary battery is higher than the second over-discharge reference value or is equal to or less than the first over-discharge reference value as a result of the comparison by the voltage measuring unit, the control unit may operate the charger.

In the exemplary embodiment, when the vehicle is a vehicle using electric energy, the charger may receive power from a main battery that drives a motor of the vehicle and charge the auxiliary battery.

In the exemplary embodiment, the control unit may store the voltage of the auxiliary battery measured by the voltage measuring circuit for every predetermined period.

In the exemplary embodiment, the control unit may compare the voltage of the auxiliary battery measured by the voltage measuring circuit with a pre-stored voltage of the auxiliary battery measured in a previous period, and when a difference between the voltage of the auxiliary battery measured by the voltage measuring circuit and the pre-stored voltage of the auxiliary battery measured in the previous period is a predetermined value or more, the control unit may diagnose that the auxiliary battery has failure.

In the exemplary embodiment, when the control unit diagnoses that the auxiliary battery has the failure, the control unit may warn a user of the failure of the auxiliary battery.

According to the exemplary embodiment of the present invention, even when a ignition of a vehicle is off, the voltage measuring circuit measures a voltage of the auxiliary battery for every predetermined period, so that it is possible to prevent the auxiliary battery from being over-discharged.

Accordingly, there is an effect of increasing a usage life of the auxiliary battery.

According to the exemplary embodiment of the present invention, the voltage measuring circuit measures a voltage of the auxiliary battery for every predetermined period, and only when the measured voltage of the auxiliary battery has an over-discharge reference value or less, the control unit is operated, thereby minimizing power consumption.

The foregoing summary is illustrative only and is not intended to be in any way limiting. In addition to the illustrative aspects, embodiments, and features described above, further aspects, embodiments, and features will become apparent by reference to the drawings and the following detailed description.

Figure 1:
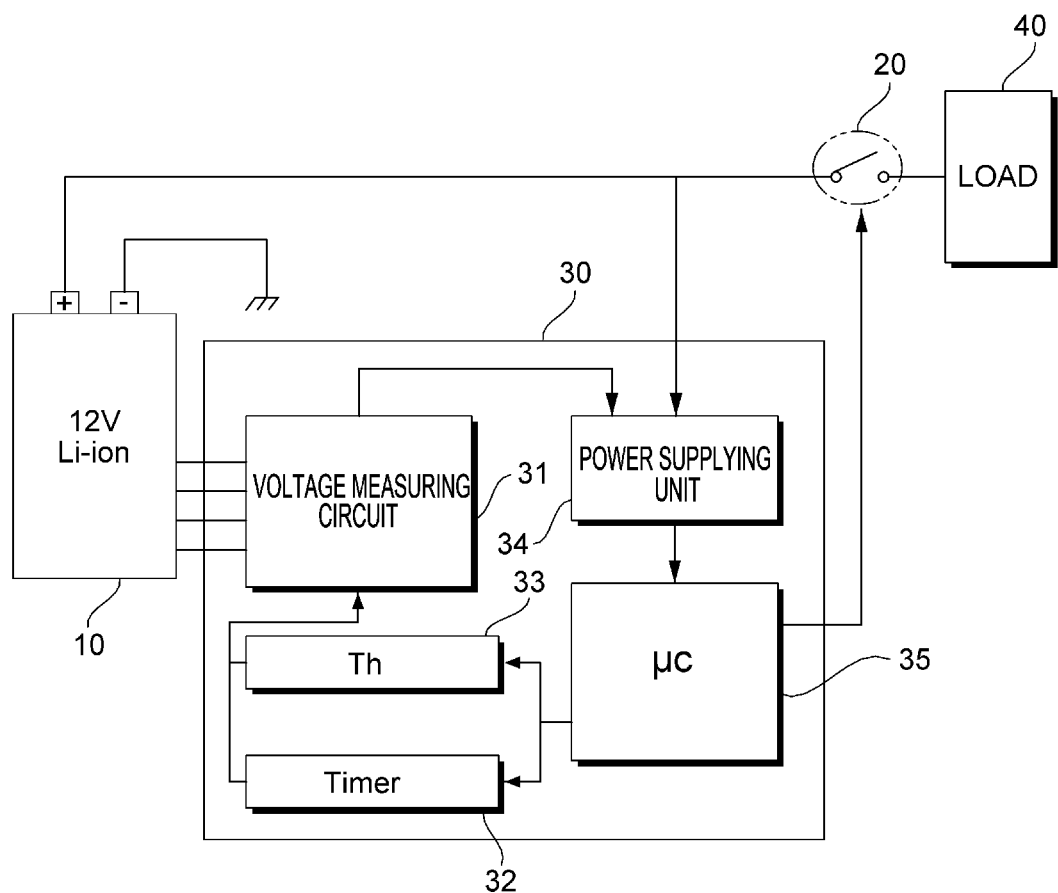
FIG. 1 is a configuration diagram of a battery over-discharge preventing apparatus according to an exemplary embodiment of the present invention.

It should be understood that the appended drawings are not necessarily to scale, presenting a somewhat simplified representation of various features illustrative of the basic principles of the invention. The specific design features of the present invention as disclosed herein, including, for example, specific dimensions, orientations, locations, and shapes will be determined in part by the particular intended application and use environment.

In the figures, reference numbers refer to the same or equivalent parts of the present invention throughout the several figures of the drawing.

DETAILED DESCRIPTION

Hereinafter, exemplary embodiments of the present invention will be described in detail with reference to the accompanying drawings.

Hereinafter, a battery over-discharge preventing apparatus according to an exemplary embodiment of the present invention will be described with reference to FIG. 1.

FIG. 1 is a configuration diagram of a battery over-discharge preventing apparatus according to an exemplary embodiment of the present invention.

Referring to FIG. 1, the battery over-discharge preventing apparatus according to the exemplary embodiment of the present invention may include a latch relay 20 and a BMS 30.

The battery over-discharge preventing apparatus according to the exemplary embodiment of the present invention may be an apparatus for preventing over-discharge of an auxiliary battery 10 provided in a vehicle.

The auxiliary battery 10 may supply power to a load 40 of the vehicle. In this case, the auxiliary battery 10 may be a lithium ion battery. Unlike an auxiliary battery formed of a lead storage battery, the auxiliary battery formed of lithium ions has a problem in that the auxiliary battery cannot be re-used when the auxiliary battery is discharged. Accordingly, the lithium ion battery requires more effective prevention of over-discharge. In the meantime, the load 40 means an electronic component, such as a lamp and a control unit, provided in the vehicle.

The latch relay 20 may connect the auxiliary battery 10 and the load 40 or disconnect the auxiliary battery 10 and the load 40. Particularly, when the latch relay 20 is turned on, the auxiliary battery 10 and the load 40 may be connected with each other, and when the latch relay 20 is turned off, the auxiliary battery 10 and the load 40 may be separated from each other. In the meantime, the latch relay 20 may have a characteristic in that an on-state of the latch relay 20 is continuously maintained when a signal in the form of a pulse is once applied, unlike a general relay. Accordingly, when a ignition of the vehicle is off in the on-state of the latch relay 20, the latch relay 20 is maintained in the on-state, so that there is a danger in that a voltage of the auxiliary battery 10 is continuously discharged.

The BMS 30 may include a voltage measuring circuit 31, a timer 32, a reference voltage setting device 33, a power supplying unit 34, and a control unit 35.

The voltage measuring circuit 31 may measure a voltage of the auxiliary battery 10. Particularly, when the ignition of the vehicle is on, the voltage measuring circuit 31 may continuously measure a voltage of the auxiliary battery 10. In the meantime, when the ignition of the vehicle is off, the voltage measuring circuit 31 may measure a voltage of the auxiliary battery 10 for every predetermined period.

The voltage measuring circuit 31 may compare the measured voltage of the auxiliary battery 10 with an over-discharge reference value. In this case, the over-discharge reference value means a value serving as a reference for turning off the latch relay 20.

When the voltage of the auxiliary battery 10 is equal to or less than the over-discharge reference value, the voltage measuring circuit 31 may output an enable signal for operating the control unit 35 to the power supplying unit 34.

When the ignition of the vehicle is off, the timer 32 may set a period in which the voltage measuring circuit 31 measures a voltage of the auxiliary battery 10. Accordingly, when the ignition of the vehicle is off, the voltage measuring circuit 31 may measure a voltage of the auxiliary battery 10 for every predetermined period set by the timer 32. In this case, in the exemplary embodiment, the predetermined period may have a value in a range of 1 minute to 1 hour.

The reference voltage setting device 33 may set an over-discharge reference value. In the exemplary embodiment, the over-discharge reference value may be 1.5 V.

The power supplying unit 34 may supply operation power to the control unit 35. When the ignition of the vehicle is on, the power supplying unit 34 may continuously supply operation power to the control unit 35. In the meantime, when the ignition of the vehicle is off, the power supplying unit 34 may supply operation power to the control unit 35 only when receiving the enable signal from the voltage measuring circuit 31.

When the voltage of the auxiliary battery 10 is equal to or less than the over-discharge reference value as a result of the comparison by the voltage measuring circuit 31, the control unit 35 may turn off the latch relay 20. Accordingly, the auxiliary battery 10 may be separated from the load 40 and the auxiliary battery 10 may be prevented from being voltage-discharged.

Hereinafter, a battery over-discharge preventing apparatus according to another exemplary embodiment of the present invention will be described with reference to FIG. 2.

Figure 2:
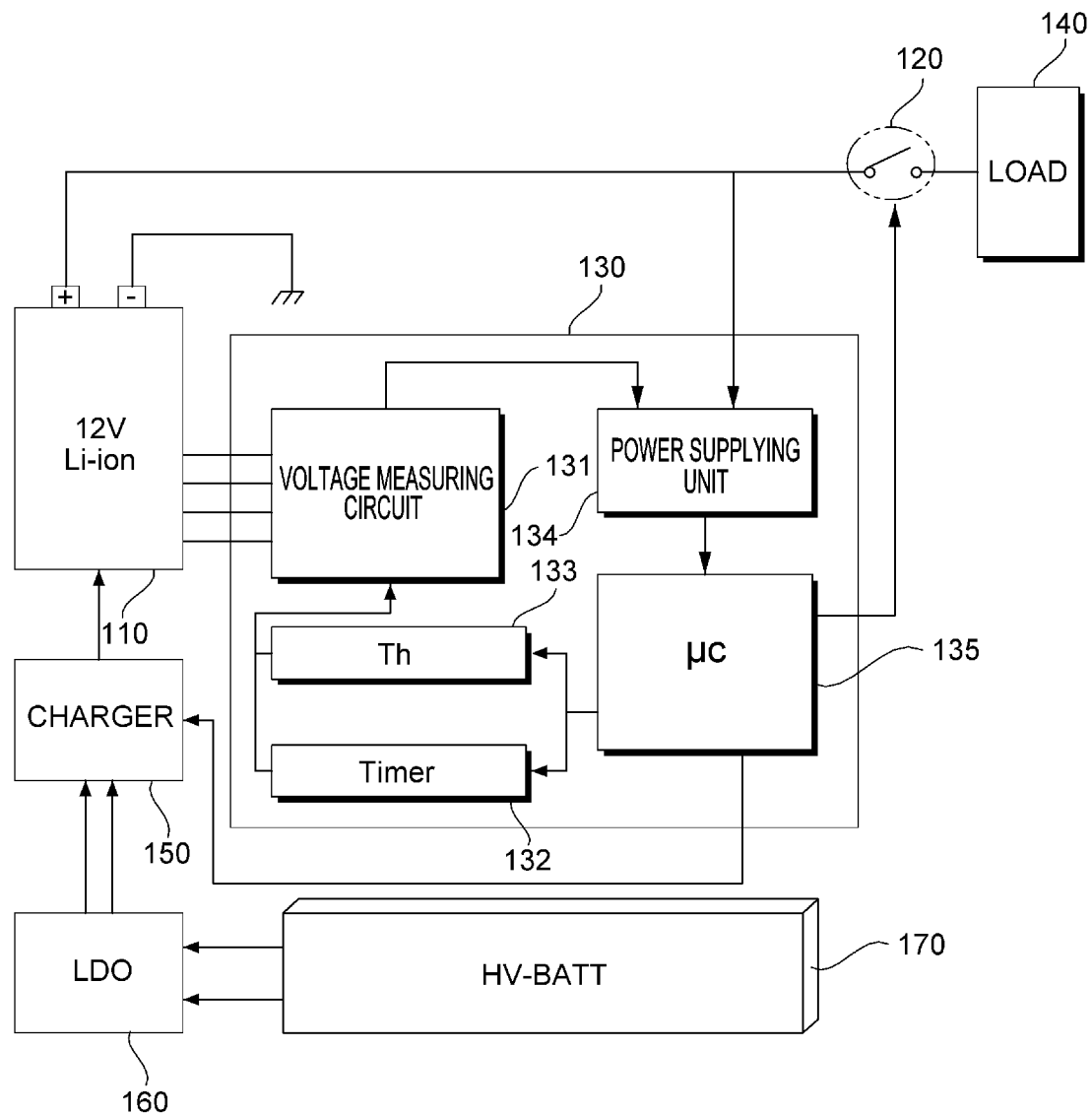
FIG. 2 is a configuration diagram of a battery over-discharge preventing apparatus according to another exemplary embodiment of the present invention.

FIG. 2 is a configuration diagram of a battery over-discharge preventing apparatus according to another exemplary embodiment of the present invention.

Referring to FIG. 2, the battery over-discharge preventing apparatus according to the exemplary embodiment of the present invention may include a latch relay 120, a BMS 130, and a charger 150.

The battery over-discharge preventing apparatus according to the exemplary embodiment of the present invention may be an apparatus for preventing an auxiliary battery 110 provided in a vehicle that uses electric energy from being over-discharged. That is, the vehicle may be an electric vehicle (EV), a hybrid electric vehicle (HEV), and the like.

The auxiliary battery 110 may supply power to a load 140 of the vehicle. In this case, the auxiliary battery 110 may be a lithium ion battery. Unlike an auxiliary battery formed of a lead storage battery, the auxiliary battery formed of lithium ions has a problem in that the auxiliary battery cannot be re-used when the auxiliary battery is discharged, so that a more effective prevention of over-discharge is required. In the meantime, the load 140 may mean an electronic component, such as a lamp and a control unit, provided in the vehicle.

The latch relay 120 may connect the auxiliary battery 110 and the load 140 or separate the auxiliary battery 110 from the load 140. Particularly, when the latch relay 120 is turned on, the auxiliary battery 110 and the load 140 may be connected with each other, and when the latch relay 120 is turned off, the auxiliary battery 110 and the load 140 may be separated from each other. In the meantime, unlike a general relay, the latch relay 120 may have a characteristic in that an on-state of the latch relay 120 is continuously maintained when a signal in the form of a pulse is once applied. Accordingly, when a ignition of the vehicle is off in the on-state of the latch relay 120, the latch relay 120 is maintained in the on-state, so that there is a danger in that a voltage of the auxiliary battery 110 is continuously discharged.

The BMS 130 may include a voltage measuring circuit 131, a timer 132, a reference voltage setting device 133, a power supplying unit 134, and a control unit 135.

The voltage measuring circuit 131 may measure a voltage of the auxiliary battery 110. Particularly, when the ignition of the vehicle is on, the voltage measuring circuit 131 may continuously measure a voltage of the auxiliary battery 110. In the meantime, when the ignition of the vehicle is off, the voltage measuring circuit 131 may measure a voltage of the auxiliary battery 110 for every predetermined period.

The voltage measuring circuit 131 may compare the measured voltage of the auxiliary battery 110 with the plurality of over-discharge reference values. In this case, the plurality of over-discharge reference values may include a first over-discharge reference value that serves as a reference for charging the auxiliary battery 110 and a second over-discharge reference value that serves as a reference for turning off the latch relay 120. In this case, the first over-discharge reference value may be higher than the second over-discharge reference value.

When the voltage of the auxiliary battery 110 is equal to or less than a predetermined over-discharge reference value among the plurality of over-discharge reference values, the voltage measuring circuit 131 may output an enable signal for operating the control unit 135 to the power supplying unit 134. That is, the voltage measuring circuit 131 may output the enable signal for operating the control unit 135 to the power supplying unit 134 even when the voltage of the auxiliary battery 110 is equal to or less than the first over-discharge reference value, as well as the case where the voltage of the auxiliary battery 110 is equal to or less than the second over-discharge reference value.

When the ignition of the vehicle is off, the timer 132 may set a period in which the voltage measuring circuit 131 measures a voltage of the auxiliary battery 110. Accordingly, when the ignition of the vehicle is off, the voltage measuring circuit 131 may measure a voltage of the auxiliary battery 110 for every predetermined period set by the timer 132. In this case, the predetermined period may have a value in a range of 1 minute to 1 hour.

The reference voltage setting device 133 may set the plurality of over-discharge reference values. In this case, as described above, the plurality of over-discharge reference values may include the first over-discharge reference value and the second over-discharge reference value. In the exemplary embodiment, the first over-discharge reference value may be 3 V, and the second over-discharge reference value may be 1.5 V.

The power supplying unit 134 may supply operation power to the control unit 135. When the ignition of the vehicle is on, the power supplying unit 134 may continuously supply operation power to the control unit 135. In the meantime, when the ignition of the vehicle is off, the power supplying unit 134 may supply operation power to the control unit 135 only when receiving the enable signal from the voltage measuring circuit 131.

When the voltage of the auxiliary battery 110 is higher than the second over-discharge reference value, but is equal to or less than the first over-discharge reference value as a result of the comparison by the voltage measuring circuit 131, the control unit 135 may operate the charger 150. Accordingly, the auxiliary battery 110 may be voltage-charged. That is, when the voltage of the auxiliary battery 110 is higher than the second over-discharge reference value, but is equal to or less than the first over-discharge reference value, it is not that the voltage of the auxiliary battery 110 is over-discharged to the degree in which the latch relay 120 needs to be turned off, so that control unit 135 may prevent the auxiliary battery 110 from being over-discharged by preferentially voltage-charging the auxiliary battery 110.

When the voltage of the auxiliary battery 110 is equal to or less than the second over-discharge reference value as a result of the comparison by the voltage measuring circuit 131, the control unit 135 may turn off the latch relay 120. Accordingly, the auxiliary battery 110 may be separated from the load 140 and the auxiliary battery 110 may be prevented from being voltage-discharged. That is, when the voltage of the auxiliary battery 110 is equal to or less than the second over-discharge reference value, the voltage of the auxiliary battery 110 is over-discharged in the degree in which the latch relay 120 needs to be turned off, so that the control unit 135 may prevent the auxiliary battery 110 from being over-discharged by turning off the latch relay 120.

The control unit 135 may store the voltage of the auxiliary battery 110 that is measured by the voltage measuring circuit 131 for every predetermined period. That is, when the predetermined period is 1 hour, the control unit 135 may store the voltage of the auxiliary battery 110 that is measured by the voltage measuring circuit 131 for every 1 hour.

The control unit 135 may compare the voltage of the auxiliary battery 110 measured by the voltage measuring circuit 131 with a pre-stored voltage of the auxiliary battery 110 measured in a previous period, and when a difference between the voltage of the auxiliary battery 110 measured by the voltage measuring circuit 131 and the pre-stored voltage of the auxiliary battery 110 measured in the previous period is equal to or higher than a predetermined value as a result of the comparison, the control unit 135 may diagnose that the auxiliary battery 110 has failure. In this case, the predetermined value may be a value obtained by subtracting a second over-discharge preventing value from a first over-discharge preventing value. That is, when the first over-discharge preventing value is 3 V and the second over-discharge preventing value is 1.5 V, the predetermined value may be 1.5.

For example, when the voltage of the auxiliary battery 110 currently (an $N^{th}$ period) measured by the voltage measuring circuit 131 is 1.9 V and the voltage of the auxiliary battery 110 that is stored in the control unit 135 and is measured in a previous period (an $N-1^{th}$ period) is 2.9 V, the control unit 135 may diagnose that the auxiliary battery 110 is normal.

In the meantime, when the voltage of the auxiliary battery 110 currently (an $N^{th}$ period) measured by the voltage measuring circuit 131 is 1.3 V and the voltage of the auxiliary battery 110 that is pre-stored in the control unit 135 and is measured in a previous period (an N−1$^{th}$ period) is 2.9 V, the control unit 135 may diagnose that the auxiliary battery 110 has failure.

That is, when the first over-discharge preventing value is 3 V, the second over-discharge preventing value is 1.5 V, and the predetermined value is 1.5 V, the voltage of the auxiliary battery 110 measured in the N−1$^{th}$ period is 2.9 V, so that the control unit 135 charges the auxiliary battery 110, and the voltage of the auxiliary battery 110 measured in the N$^{th}$ period is further decreased to 1.3 V, so that the control unit 135 may turn off the latch relay 120. In the meantime, even though the control unit 135 charges the auxiliary battery 110, the voltage of the auxiliary battery 110 is decreased to the predetermined value or more, so that the control unit 135 may diagnose that the auxiliary battery 110 has failure in addition to taking the measure of turning off the latch relay 120.

When the control unit 135 diagnoses that the auxiliary battery 110 has the failure, the control unit 135 may warn a user of the failure of the auxiliary battery 110. For example, a case where the control unit 135 displays a warning text on a display device, such as an audio video navigation system (AVN) provided in the vehicle, or makes a warning sound may be introduced.

The charger 150 may receive power from a main battery 170 that drives a motor of the vehicle and charge the auxiliary battery 110. In this case, the main battery 170 has a higher voltage than that of the auxiliary battery 110, so that a voltage of the main battery 170 may be dropped through a low DC/DC converter (LDO) 160 to supply power to the charger 150.

As described above, the exemplary embodiments have been described and illustrated in the drawings and the specification. The exemplary embodiments were chosen and described in order to explain certain principles of the invention and their practical application, to thereby enable others skilled in the art to make and utilize various exemplary embodiments of the present invention, as well as various alternatives and modifications thereof. As is evident from the foregoing description, certain aspects of the present invention are not limited by the particular details of the examples illustrated herein, and it is therefore contemplated that other modifications and applications, or equivalents thereof, will occur to those skilled in the art. Many changes, modifications, variations and other uses and applications of the present construction will, however, become apparent to those skilled in the art after considering the specification and the accompanying drawings. All such changes, modifications, variations and other uses and applications which do not depart from the spirit and scope of the invention are deemed to be covered by the invention which is limited only by the claims which follow.

What is claimed is:

1. An apparatus for preventing a battery from being over-discharged, the apparatus comprising:
   a latch relay configured to connect or disconnect a load of a vehicle that receives power from an auxiliary battery and is driven;
   a voltage measuring circuit configured to measure a voltage of the auxiliary battery and compare the measured voltage of the auxiliary battery with at least one over-discharge reference value that serves as references for determining whether the auxiliary battery is over-discharged;
   a control unit configured to turn off the latch relay when the voltage of the auxiliary battery is equal to or less than the over-discharge reference value as a result of the comparison by the voltage measuring circuit;
   a power supplying unit configured to supply operation power to the control unit; and
   a timer configured to be turned on and set a predetermined period for measuring the voltage of the auxiliary battery when an ignition of the vehicle is off,
   wherein the voltage measuring circuit measures the voltage of the auxiliary battery for the predetermined period when the ignition of the vehicle is off and outputs an enable signal for operating the control unit when the voltage of the auxiliary battery is equal to or less than the over-discharge reference value, and
   the power supplying unit continuously supplies the operation power to the control unit when the ignition of the vehicle is on, and supplies the operation power to the control unit in response to the enable signal received from the voltage measuring circuit when the ignition of the vehicle is off.

2. The apparatus of claim 1, wherein the auxiliary battery includes a lithium ion battery.

3. The apparatus of claim 1, further comprising:
   a reference voltage setting device configured to set the over-discharge reference value.

4. The apparatus of claim 3, wherein the over-discharge reference value includes a first over-discharge reference value that serves as a reference for charging the auxiliary battery and a second over-discharge reference value that serves as a reference for turning off the latch relay.

5. The apparatus of claim 4, wherein the first over-discharge reference value is higher than the second over-discharge reference value.

6. The apparatus of claim 4, further comprising:
   a charger configured charge the voltage of the auxiliary battery,
   wherein when the voltage of the auxiliary battery is higher than the second over-discharge reference value or is equal to or less than the first over-discharge reference value as a result of the comparison by the voltage measuring circuit, the control unit operates the charger.

7. The apparatus of claim 6, wherein when the vehicle is a vehicle using electric energy, the charger receives power from a main battery that drives a motor of the vehicle and charges the auxiliary battery.

8. The apparatus of claim 1, wherein when the voltage of the auxiliary battery is equal to or less than the over-discharge reference value, the voltage measuring circuit outputs the enable signal for operating the control unit to the power supplying unit.

9. The apparatus of claim 8, wherein the control unit stores the voltage of the auxiliary battery measured by the voltage measuring circuit for the every predetermined period.

10. The apparatus of claim 9, wherein the control unit compares the voltage of the auxiliary battery measured by the voltage measuring circuit with a pre-stored voltage of the auxiliary battery measured in a previous period, and
when a difference between the voltage of the auxiliary battery measured by the voltage measuring circuit and the pre-stored voltage of the auxiliary battery measured in the previous period is a predetermined value or more, the control unit diagnoses that the auxiliary battery has a failure.

11. The apparatus of claim 10, wherein when the control unit diagnoses that the auxiliary battery has the failure, the control unit warns a user of the failure of the auxiliary battery.

* * * * *